United States Patent [19]

Beha et al.

[11] Patent Number: 4,868,492

[45] Date of Patent: Sep. 19, 1989

[54] METHOD FOR CONTACTLESS TESTING OF CONDUCTING PATHS IN A SUBSTRATE USING PHOTO-ASSISTED TUNNELING

[75] Inventors: Johannes G. Beha, Waedenswil; Armin U. Blacha, Rueschlikon; Rolf Clauberg, Gattikon; Hugo K. Seitz, Wollerau, all of Fed. Rep. of Germany

[73] Assignee: International Business Machines Corporation, Armonk, N.Y.

[21] Appl. No.: 107,441

[22] Filed: Oct. 9, 1987

[30] Foreign Application Priority Data

Oct. 23, 1986 [EP] European Pat. Off. ........ 86114712.2

[51] Int. Cl.$^4$ .......................................... G01R 31/02
[52] U.S. Cl. ............................ 324/73 PC; 324/158 R; 324/501; 324/538
[58] Field of Search ............ 324/73 PC, 73 R, 158 R, 324/501, 538, 96

[56] References Cited

U.S. PATENT DOCUMENTS

| | | | |
|---|---|---|---|
| 3,436,651 | 4/1969 | Helms et al. | 324/51 |
| 3,763,425 | 10/1973 | Engelke | 324/538 |
| 3,764,898 | 10/1973 | Bohlen et al. | 324/538 |
| 4,296,372 | 10/1981 | Feuerbaum | 324/71 |
| 4,415,851 | 11/1983 | Langner et al. | 324/501 |
| 4,417,203 | 11/1983 | Pfeiffer et al. | 324/158 R |
| 4,507,605 | 3/1985 | Geisel | 324/73 |
| 4,618,819 | 10/1986 | Mourou et al. | 324/77 K |
| 4,644,264 | 2/1987 | Beha et al. | 324/73 B |
| 4,703,260 | 10/1987 | Beha et al. | 324/158 R |
| 4,712,057 | 12/1987 | Pau | 324/73 R |
| 4,733,174 | 3/1988 | Crosby | 324/158 R |

FOREIGN PATENT DOCUMENTS

| | | |
|---|---|---|
| 0005762 | 12/1979 | European Pat. Off. . |
| 0128107 | 12/1984 | European Pat. Off. . |
| 0196475 | 8/1986 | European Pat. Off. . |
| 2309371 | 9/1973 | Fed. Rep. of Germany . |
| 60-206147 | 10/1985 | Japan . |

Primary Examiner—Ernest F. Karlsen
Attorney, Agent, or Firm—Daniel P. Morris

[57] ABSTRACT

For testing the integrity of conducting lines on or in a substrate, the following steps are executed: (I) Selected pads are irradiated by a focused optical beam so that they are positively charged due to photon-assisted tunneling of electrons from those pads. The charges propagate through existing conductors so that all selected pads and all pads connected to them assume a specific voltage. (II) The whole surface is irradiated by a flooding optical beam. Photon-assisted tunneling of electrons will now occur from those pads which were not charged previously. (III) The tunneling electrons excite an electroluminescent layer whose illumination reveals the spatial distribution of uncharged pads. This method is performed in air under atmospheric conditions and allows completely contactless testing of circuitry to detect line interruptions as well as shortcuts between separate lines. It is suited for surface lines, buried lines and for via connections.

9 Claims, 4 Drawing Sheets

METHOD FOR CONTACTLESS TESTING OF CONDUCTING PATHS IN A SUBSTRATE USING PHOTO-ASSISTED TUNNELING

CROSS REFERENCES TO RELATED COPENDING APPLICATIONS

Copending U.S. patent application Ser. No. 107,443 filed on the same date as the present application entitled "PHOTOELECTRIC CONTACTLESS TESTING OF CONDUCTING PATHS OF A SUBSTRATE" of J. G. Beha et al, and assigned to the same assignee as the present invention, describes a method for contactless testing the integrity of conducting path on or in a substrate, by the following steps: (I) selected pads are irradiated by an optical beam so that they are positively charged due to photoemission of electrons. The charges propagate through existing conductors so that all selected pads and all pads connected to them assume a specific voltage. (II) The whole surface is irradiated by a flooding optical beam. Photoemission of electrons will now occur from those pads which were not charged previously. (III) The photoelectrons emitted in step II are detected thus revealing the spatial distribution of uncharged pads, permitting detection of line opens and shorts of conducting paths.

FIELD OF INVENTION

Present invention is concerned with the testing of electrical connections in circuit substrates, and in particular with the testing of interconnection lines and via connections in boards for packaging integrated circuit chips. It is generally suited for testing conducting lines or via connections in substrates.

BACKGROUND

The testing of integrated circuits and of their interconnections in packaging is an important task in the manufacturing of electronic and data processing equipment. It is particularly important that the testing methods are fast and do not require much preparatory operations for their execution.

In principle, testing can be done by applying power and data signals to, and extracting resulting data signals and electrical conditions from, circuitry through the regular connection pins, or through mechanical contact probes. Such testing is, however, slow and not very effective because of the limited number of connections which can be made. It is, therefore, not well suited for highly integrated circuits and dense packaging which are used today.

Therefore, some methods of contactless testing have been recently suggested using either electron beam or laser technology. E-beam testing was described in an article by E. Menzel et al.: "Fundamentals of Electron Beam Testing of Integrated Circuits", published in Scanning, Vol. 5 (1983), pp. 103–122. The E-beam is used as a contactless probe, either in a passive or active mode. However, the utilization of electron beams for testing has certain disadvantages and limitations. These are the need for vacuum environment during testing and the fact that individual pads have to be tested sequentially, i.e. no full-package approach (flooding the substrate with a wide beam) is possible. During such a process the insulating substrate would charge up and eliminate contrast against the pads.

More recently, the use of a laser beam for integrated circuit testing has been suggested. The photons of a laser beam can excite electron emission from the target, and the laser beam can thus be used for contactless testing of electronic circuitry.

European patent application publication No. 0,196,475 (U.S. counterpart Pat. No. 4,644,264 entitled "Noncontact Testing of Integrated Circuits" discloses a technique of covering an integrated circuit chip by an insulating layer and a metallic overlayer, and the directing a laser beam to a test point on the chip causing tunneling of electrons in an intensity which depends on the potential of the respective point. The respective pulse generated in the metallic overlayer is then evaluated.

In European patent application No. 0,216,077 (U.S. counterpart Ser. No. 778,823 filed Sept. 23, 1985) a testing procedure is described in which laser light is directed to the entire surface of a circuit chip, and in which that laser light causes generation of photoelectrons in dependance of the voltage present at each point. The electrons generated are directed either to a luminescent target whose image is then evaluated, or the electrons are directed to channel plates and further to a luminescent target and an optical processing system. Also shown is the utilization of a passivation layer, a luminescent layer, and a metallic overlayer on a circuit chip to attain, with the aid of laser light directed to the whole chip area, voltage dependent photon-assisted electron tunneling through the passivation layer and to thus allow testing in air.

In both systems disclosed in the two above-mentioned European patent applications, power and test data signals have to be applied to the tested circuits through normal pins and chip connections, to bring them into an operating status that is to be detected in the testing procedure. This is a limitation of the testing possibilities.

OBJECTS OF THE INVENTION

It is a primary object of present invention to provide a testing method which is contactless and thus does not require the establishment of connections for the application of power and test data to the circuits to be tested.

It is a further object of this invention to devise a testing method which is particularly suited for testing the conducting lines in packaging boards for integrated circuitry.

Another object of the invention is to provide a testing procedure which does not require vacuum and thus can be executed under atmospheric conditions, i.e. in air.

A further object is a testing method which enables simple, fast and simultaneous testing of via connections through a substrate.

DISCLOSURE OF THE INVENTION

According to a method of the present invention a potential barrier is provided on the surface of a substrate, e.g., the surface of a board to be tested, through which electrons are caused to tunnel from pads on the substrate surface. The potential barrier can be provided by forming some thin layers of additional material on the board to be tested. The electrons tunneling from the pads substantially do not interact with the material layers forming the potential barrier. Therefore, the emitted electron current is great enough for the test method to be done in air. These layers include an insulating material and a very thin, transparent electrode.

They also include an electron-sensitive layer such as an electroluminescent layer.

In the first step of the actual testing procedure, an optical beam, e.g., a laser beam, is directed onto selected pads, thus causing tunneling of electrons from such pads towards the thin electrode, leaving a positive charge in each selected pad but also in all conducting lines and other pads which are electrically connected to the selected pads. In a following step, an optical beam is again directed to the tested board's surface, and it causes then a specific pattern of photon-assisted electron tunneling which is dependent on the previously induced voltages. This pattern of different electron tunneling intensity will then cause a luminescence pattern in the electroluminescent layer which then can be evaluated to determine which pads are electrically connected to initially selected pads, and which are not.

In an alternative solution, the electroluminescent layer is replaced by an electrooptic layer for detecting the voltage pattern which is generated in step (I) of the testing procedure. This first step of charging pads with the aid of an optical beam causing photon-assisted tunneling from selected spots is the same in the alternative solution. The voltages induced in this first step will result in differing polarization rotations thus attaining a pattern or image of the voltages in pads which in turn reflects their electrical connections to or disconnection from previously selected pads.

The new testing method has the advantage that it can be used for surface lines, buried lines, as well as for via connections, and that it allows the simultaneous testing of several connections which is of particular interest for via connections between different surfaces of a packaging substrate.

These and other objects, features and advantages will be apparent from the following more particular description of the preferred embodiments.

LIST OF DRAWINGS

FIG. 1A, FIG. 1B, and FIG. 1C are a schematic representation of the sequential steps of the invented testing method for testing connections between pads on one side of a circuit board;

DETAILED DESCRIPTION

(1) PRINCIPLE OF INVENTION

The testing procedure of present invention is of primary interest for packaging, i.e. for testing the circuits and conducting lines which are provided between pads on circuit boards. Such circuit boards are used for carrying and interconnecting individual chips which were tested already previously.

Figure 1A:
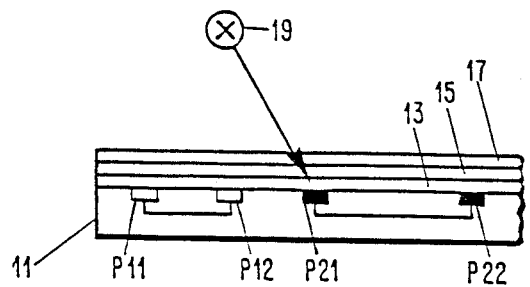
Figure 1B:
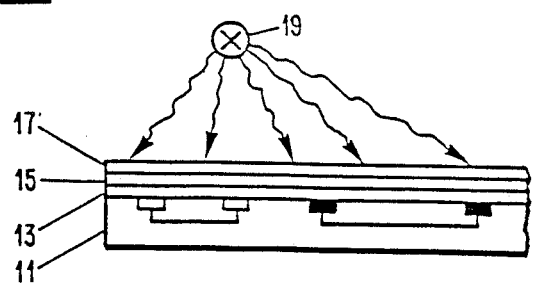
Figure 1C:
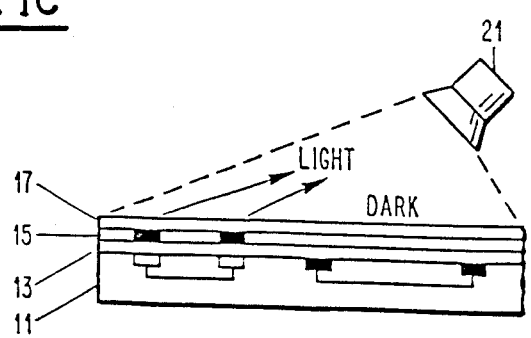

FIG. 1A, FIG. 1B and FIG. 1C are a schematic representation of the new testing method. The three main steps of the method are represented in the three figures FIG. 1A, FIG. 1B and FIG. 1C. It should be noted that the testing can be done in air, i.e. under atmospheric conditions.

Prior to the testing operations, a potential barrier is formed at least over the contact pads to be tested. It is the preferred embodiment to form the potential barrier by applying two thin layers of specific material to the surface of the board. Electrons are caused to tunnel from pads on the surface on which the potential barrier is formed by exposing the surface of the board to an optical beam. A third electron sensitive layer is added to detect the electrons tunneling through the barrier. The three layers are schematically shown in FIG. 1A, FIGS. 1B and 1C are: Directly on the surface of board 11, there is a thin layer 13 of passivating material, e.g. an oxide. The next layer 15 is an electroluminescent layer which can be excited by electrons to emit light. On top of the electroluminescent layer, a third layer 17 is deposited which consists of conducting material but which is so thin that it is transparent (to enable the passage of photons through it). This layer 17 constitutes an electrode which can attract electrons when connected to a suitable voltage. Depending on the technology, the top two layers 15 and 17 may stay or may have to be removed after the testing operation.

For convenience, the invention will be further described in terms of the use of a laser as the source of an optical beam. However, it should be understood that the method is not limited to the use of a laser.

For a conductor on the surface of the substrate, a pad can be any part of the conductor on the surface. For a conductor within the substrate, a pad is an extension of the conductor to the surface of the substrate.

In the first step (I) of the testing procedure the circuit board 11 containing the circuits or conductors to be tested is subjected to a laser beam from laser device 19 (ultraviolet laser). The laser beam can be directed to selected spots on the board 11 by a scanning mechanism, and it can be switched on and off. There are shown two pairs of pads P11/P12 and P21/P22, each pair being interconnected by a conductor which is to be tested. In this first step, one of the pads, e.g. P21, is subjected to the laser beam. Due to photon-assisted tunneling of electrons from the conducting material of this spot towards electrode layer 17 which attracts them, pad 21 will be charged positively, but not the surrounding insulator surface of board 11. The reason for this good contrast is the fact that the photon energy for the laser irradiation is chosen such that it is large enough to cause tunneling of electrons from the metallic pads, but is too small to excite photon-assisted tunneling from the ceramic substrate.

The charges collecting on the selected pad P21 will propagate through all portions of the electrical circuitry which are connected to P21, in this case through the conductor to pad P22. Thus, at the end of step (I), P21 and also P22 should be both at the same potential, which is different from the potential at all other surface spots of the board, if the circuitry between P21 and P22 is intact. However, if there would be a discontinuity in the conductor between P21 and P22, P22 would not be at the higher potential; furthermore, if there would be a short circuit connection between P21 and P12, the charges would distribute to both pads P12 and P11 so that both would be at the higher potential which is also present on P21 and P22. The specific voltage level at the selected pads and pads connected to them will depend on the laser power used, the irradiation time, and the conductor material.

Therefore, by first selectively charging selected points of the circuitry to be tested, and then detecting on which non-irradiated spots the higher potential appears, defects in the circuitry or conductors can be determined.

Steps (II) and (III) are executed for the detecting operation which actually is a voltage-contrast measurement. In step (II), the whole surface of board 11 is flooded by a widespread laser beam from laser device 19. This will cause photon-assisted tunneling of electrons from all metallic surface areas which were previously not charged positively. Thus, there will be no electron tunneling from those metallic spots which are at a higher potential than the surrounding surface of board 11; in the case of intact circuitry, these spots would be pads P21 and P22 in the present example. The areas of the surface of board 11 from which electrons are tunneling through the passivation or oxide layer 13 towards electrode layer 17 will cause luminescence in the respective portions of electroluminescent layer 15 (previously charged spots will be dark).

In step (III), the particular pattern of luminescence which reveals the previously charged spots is detected. A TV camera (vidicon tube) 21 can be used for this purpose. The output scan signal of this camera will be a time-sequential representation of the illumination intensity of each spot of the surface of board 11. Thus, the spatial distribution of charges which is an indication for the potentials of all metallic spots of the board surface, can be obtained and then e.g. be stored or directly processed in a computer for obtaining the test results.

Testing of Via Connections

Figure 2A:
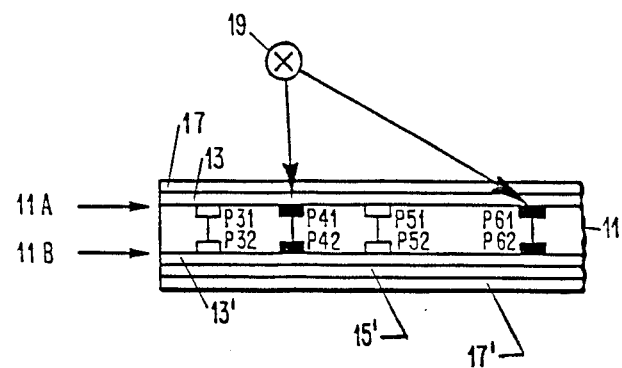
FIG. 2A, FIG. 2B and FIG. 2C are a schematic representation of the sequential steps of the invented method for testing via connections.
Figure 2B:
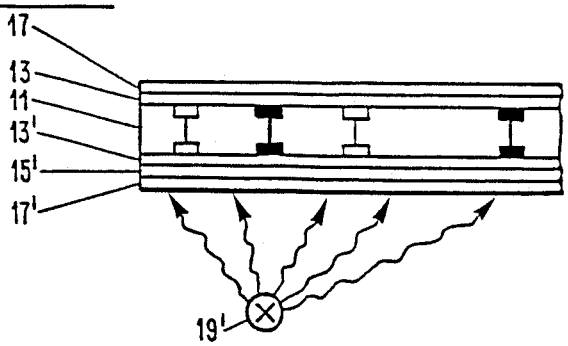
Figure 2C:
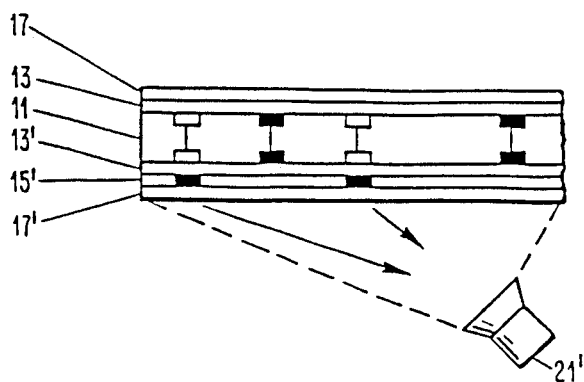

So far, the testing was only done on one side of the board. For testing via connections, i.e. conductors between pads on different surfaces of the board, a potential energy barrier is provided initially on both surfaces of the board (FIG. 2A, FIG. 2B and FIG. 2C). On one surface (11A) it is sufficient to provide two layers, forming the potential barrier, i.e. an insulating layer 13 and a thin conducting layer 17, to enable selective charging of pads by a focused laser beam. On the other surface (11B), three layers 13', 15', and 17' (including an electroluminescent layer) are provided to enable excitation of photon-assisted tunneling from charged spots by laser as well as its detection with the aid of electroluminescence. Then, the board would either have to be turned over after step (I)—if the induced charges sustain for a sufficient long time—or the flooding laser and the detecting camera would have to be provided on the other side of the board, as is shown in FIG. 2A, FIG. 2B and FIG. 2C. In the case of FIG. 2A, FIG. 2B and FIG. 2C, via connections are provided between pairs of pads P31/P32 ... P61/P62, respectively. Otherwise, procedure steps I, II, and III correspond to those described in connection with FIG. 1A, FIG. 1B and FIG. 1C. If there are via connections and also surface lines or buried lines with pads on both surfaces, all three layers (13, 15, 17 and 13', 15', 17') would have to be provided initially on both surfaces.

There is of course also the possibility of testing all via connections in a board simultaneously. In this case, step (II) of the procedure would consist of flooding the whole surface area 11A with a laser beam to charge all via pads located on that side of the board. Then, for all intact vias the respective pads on the other surface 11B would be charged; for each interrupted via, the corresponding pad on the other surface 11B would have no charge. Steps (II) and (III) for simultaneous via testing are the same as for individual via testing: flooding of the whole other surface 11B by a laser beam, and detecting the electroluminescence pattern by the TV camera.

(2) EMBODIMENT OF A TESTING FACILITY USING THE INVENTION

Figure 3:
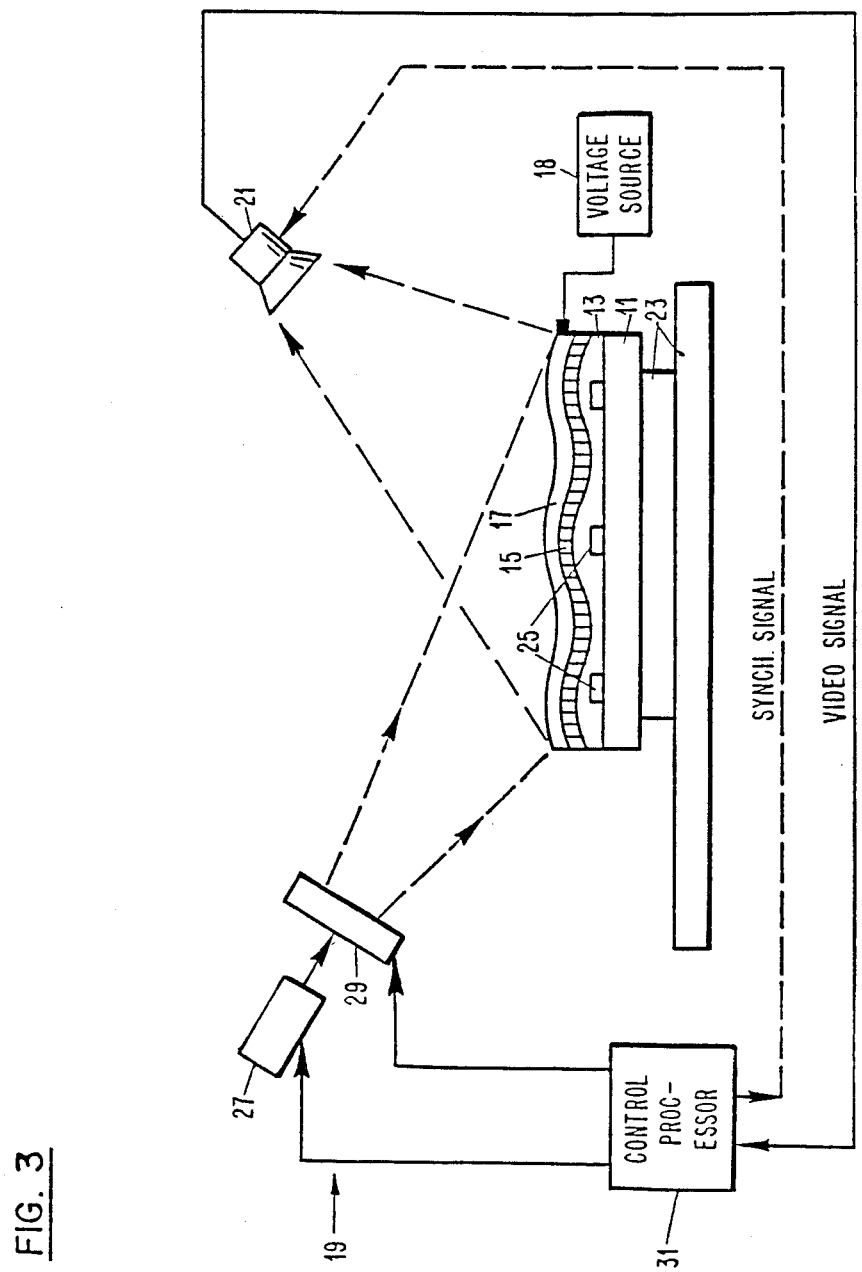
FIG. 3 shows the essential components and their interrelationship in a testing facility for executing the invented method.

FIG. 3 illustrates a testing facility in which the invention is used. A base plate and support 23 is provided for holding circuit board (package substrate) 11. On the surface of board 11, electrical connection pads 25 are shown schematically, as well as the three thin layers consisting of insulating material (13), of electroluminescent material (15), and of transparent conducting material (17), respectively. The thin electrode layer 17 is connected to a voltage source 18 of 1 ... 5 Volts. Circuits or conductors to be tested are not shown in this drawing.

Laser device 19 comprises a source 27 of ultraviolet laser light and a scanner/flooder arrangement 29. Scanner/flooder 29 is a suitable means for focussing and deflecting the laser beam emitted from source 27 to selected points on board 11, or for providing a wide-angle laser beam covering the whole surface of board 11. The scanner/flooder may be a commercial system as used in purely optical laser scanning microscopes, based on a rotating polygon mirror plus focusing/beam spreading objective. As such focusing and deflection means are well known they need not be described here in more detail.

A control processor unit 31 is provided for furnishing suitable control signals for laser source 27 (switching the beam on and off) and for scanner/flooder 29 (coordinate signals for selected points to be charged for testing, or control signal for providing a wide-angle laser beam). The basic data for any testing procedure are stored previously in control processor unit 31.

The electrons emanating during laser flooding from the non-charged metallic spots on the surface of board 11 which thus represent the spatial distribution of potentials propagate to luminescent layer 15; its image can be recorded by a TV camera 21. The scanning signals of this camera which are a sequential representation of the spatial illumination distribution on layer 17 can then be evaluated. For this purpose, the test result data are furnished sequentially to control processor unit 31 from where they can be extracted for a final evaluation of the test, or for producing a printout of the test results for the respective board.

(3) CIRCUIT/CONDUCTOR CONFIGURATIONS WHICH CAN BE TESTED

FIG. 4A, FIG. 4B, FIG. 4C and FIG. 4D illustrates the different basic testing possibilities which are available when using the testing method of present invention.

Figure 4A:
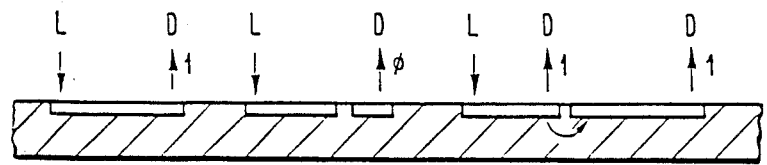
FIG. 4A, FIG. 4B, FIG. 4C and FIG. 4D illustrate the testing possibilities of the invention for different line structures and connections.
Figure 4B:
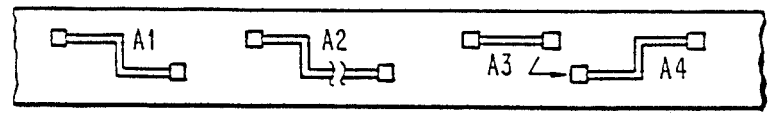

FIG. 4A and FIG. 4B there are shown a few simple connections A1, A2, A3, and A4 between pairs of pads. All of these connections are located at the surface of the board, as can be seen in the sectional side view. For testing, a laser beam is first selectively directed to the left pad of connection A1, A2, or A3 in method step I (each connection is separately tested). In the figure, this is indicated by an arrow with an "L". The detection in method step III is indicated by an arrow with a "D". For normal connection A1 the detection will show that the charges have propagated to the right pad (indicated by a "1"). For interrupted connection A2, the expected potential will not be detected at the right pad (indicated by a "0"). For normal connection A3 the result at the right pad is the same as for A1. However, a short circuit is assumed between A3 and A4. Thus, though no laser beam was directed to a pad of connection A4, the detection step after charging a pad of A3 will result in a high potential indication from the pads of A4 (indicated by a "1" on the right pad).

Figure 4C:
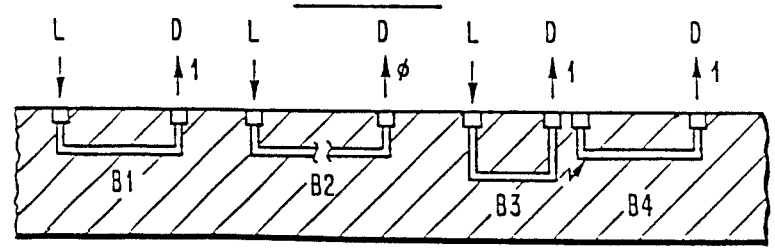

In FIG. 4C, there are shown four buried connections B1, B2, B3, and B4 between pairs of surface pads. The buried conductors are neither visible nor can they be charged by a laser beam, but they can nevertheless be tested by the method of the invention. The explanations given for FIG. 4A and FIG. 4B with respect to selective charging of pads by laser and subsequent detection of the resulting potentials on pads apply also to the situation of FIG. 4C.

Figure 4D:
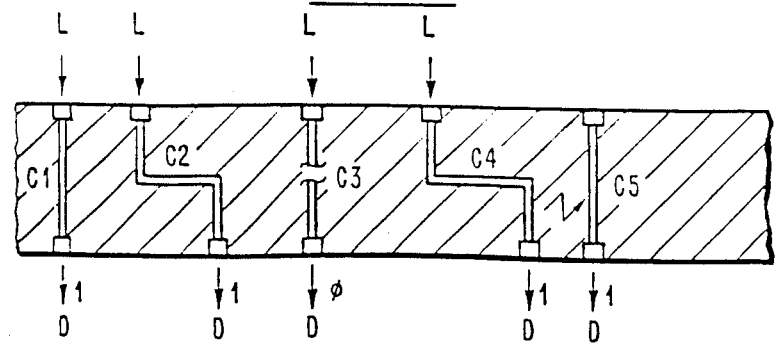

In FIG. 4D, there are shown several via conductors which interconnect pads located on opposite surfaces of the board. As was mentioned already, these via connections can also well be tested by the method of the invention. The only difference with respect to situations (A) and (B) is that the initial selective charging by a laser beam (L) in method step I is done on one surface of the board, whereas detection of resulting potential distribution (D) by method steps II and III is done on the other surface of the board.

Of course, a circuit board (package substrate) to be tested can have any combination of the electrical connections shown in FIG. 4, and there can be more complicated connections (branched conductors, conductor networks, etc.). When the testing is done in suitable sequential steps, each separate "network" can be tested for integrity, and shortcut circuits between "networks" will also be detected easily.

It is of course also possible to test different connecting lines or via connections simultaneously, e.g. if the connections which are tested simultaneously have so much distance from each other that shortcuts between them are not possible.

(4) ALTERNATE POSSIBILITY FOR READOUT/DETECTION

An alternate possibility for the readout and detection of the charge distribution introduced in step (I) of the testing procedure is given in the following.

For this alternate procedure, the second one of the three special layers, i.e. layer 15, would not be an electroluminescent layer but an electrooptic layer. Such a layer will rotate the polarization of polarized light passing through it, depending on a voltage applied to this layer.

Furthermore, in the arrangement of FIG. 3 camera 21 would be replaced in the alternative solution by a polarized light detector. Laser device 19 constitutes already a polarized light source.

The alternative arrangement operates as follows. In step (I) charging of selected pads/circuits is done by laser irradiation, as described above already. In Step (II), polarized light is flooded over the whole surface of board 11. Depending on the charges on pads 25, the polarization of the reflected light is either rotated or not rotated in electrooptic layer 15, and only the light corresponding to charged pads 25 will pass the polarization filter of the detector 21. (The polarization filter of detector 21 could of course also be adapted to transfer only light corresponding to non-charged surface areas, which would result in a complementary pattern.) Thus, the illumination of electrooptic layer 15 as detected by the polarization detector is a true picture of the spatial voltage distribution on the surface of board 11. In step (III), polarized light detector 21 which includes a scanning means will produce a sequential representation of the illumination pattern (similar as the camera 21 in the above-described basic solution) for transfer to and evaluation by the control processor 31.

While the invention has been illustrated and described with respect to preferred embodiments, it is to be understood that the invention is not limited to the precise constructions herein disclosed, and the right is reserved to all changes and modifications coming within the scope of the invention as defined in the appended claims.

We claim:

1. A method of testing the integrity of at least one conducting path on or in a nonconducting substrate, there being at least one conducting pad on the surface of said substrate, comprising:
   (a) generating charges in at least one selected pad by directing a first optical beam thereon sufficiently focused and of sufficient energy to stimulate photon-assisted tunneling of electrons from said at least one selected pad but insufficient to cause photoelectron emission from said substrate, said charges inducing a specific voltage level in said at least one selected pad and in each non-selected pad which is electrically connected to said at least one selected pad;
   (b) flooding at least one pad on at least a portion of the surface of said substrate with a second optical beam sufficiently focused and of sufficient energy to excite voltage-dependent photon-assisted electron tunneling from said at least one pad on said surface portion, the intensity of said electron tunneling being dependent on the voltage of said at least one pad on said surface portion;
   (c) collecting said voltage dependent tunneling electrons on an electron sensitive layer, said collection of said tunneling electrons exciting a luminescent pattern in said layer; and
   (d) detecting said excitation pattern in said electron-sensitive layer, to distinguish pads electrically connected to said at least one selected pads.

2. The method of claim 1, wherein prior to generating said changes a layer of insulating material is deposited over said substrate's surface and all pads located on it, a layer of electroluminescent material is deposited over said insulating layer, and a thin layer of conducting material is deposited on top of said electroluminescent layer, said conducting layer, said electroluminesient layer and said layer of insulating material being transparent to said first and said second optical beams.

3. A method for contactlessly testing the integrity of an electrically conducting path within or on a nonconducting substrate, there being a conducting pad on the surface of said substrate, comprising:
   providing a potential energy barrier on at least a part of the surface of said pad;
   contactlessly generating charges in said pad by directing a first optical beam thereon sufficiently focused and of sufficient energy to cause electrons to tunnel through said barrier inducing a voltage on said pad, substantially no charges being generated in said substrate;
   contactlessly causing a two dimensional electron flux to tunnel through said barrier on said pad by directing a second optical beam thereon sufficiently focused and of sufficient energy to cause photon assisted tunneling through said barrier, said electron flux depending on the voltage on said pad, substantially no charges being generated in said substrate; and detecting the two dimensional electron flux being emitted from said pad.

4. The method of claim 3, wherein said substrate has a plurality of pads on the surface thereof, said potential energy barrier being formed on at least two of said plurality, charges being generated in at least one of said pads and in pads electrically connected therewith, said electron flux being emitted from at least one of said pads with said barrier thereon, pads in electrical connection emitting substantially the same flux.

5. The method of claim 3 wherein said first and said second optical beam are laser beams.

6. The method of claim 3 wherein said potential energy barrier is provided on at least a part of the surface of said at least one pad by forming thereon a multilayer structure of at least a first nonconducting layer sandwiched between at least a part of the surface of said at least one pad and a conduting layer, said nonconducting layer, and said conducting layer being substantially transparent to said first and said second optical beams, a voltage being applied to said conducting layer to attract thereto electrons tunneling from said at least one pad.

7. The method of claim 6 wherein the step of detecting the two dimensional voltage dependent electron flux consists of:

providing within said multilayer structure on said at least one pad from which said electron flux is emitted, an electron sensitive layer in which a two dimensional excitation pattern is excited by said voltage dependent electron flux; and monitoring said two dimensional excitation pattern.

8. The method claim 7, wherein said electron sensitive layer is an electroluminescent layer and said excitation pattern is a two dimensional pattern of emitted light.

9. A method for contactlessly testing integrity of an electrically conducting path within or on a nonconducting substrate, there being conducting pads on the surface of said substrate, comprising:

contactlessly generating charges in at least one of said pads by directing a first optical beam thereon sufficiently focused and of sufficient energy to emit electrons therefrom inducing a voltage thereon and on pads electrically connected therewith, substantially no charges being generated in said substrate;

providing a potential energy barrier on at least a part of the surface of at least one pad;

contactlessly causing a two dimensional electron flux to tunnel through said barrier by directing a second optical beam thereon sufficiently focused and of sufficient energy to cause photon assisted tunneling from said at least one pad with said barrier thereon, said electron flux depending on the voltage thereon, substantially no charges being generated in said substrate; and detecting the two dimensional electron flux being emitted from said at least one pad with said barrier thereon.

* * * * *